United States Patent [19]

Travot et al.

[11] 3,947,890

[45] Mar. 30, 1976

[54] MAGNETO-OPTICAL READOUT APPARATUS

[75] Inventors: Guy Claude Daniel Travot, Saint-Mur-des-fosses; Gerard Rene Sirand-Rey, Roissy-en-Brie, both of France

[73] Assignee: Eastman Kodak Company, Rochester, N.Y.

[22] Filed: Sept. 11, 1974

[21] Appl. No.: 505,106

[30] Foreign Application Priority Data
Sept. 12, 1973 France ............... 73.32715

[52] U.S. Cl. ............ 360/114; 340/174 YC; 350/151
[51] Int. Cl.² ... G11B 5/32; G02B 5/23; G02F 1/09; G11C 11/02
[58] Field of Search .............. 360/114; 340/174 YC; 350/151

[56] References Cited

UNITED STATES PATENTS

| | | | |
|---|---|---|---|
| 3,268,879 | 8/1966 | Lins .................................. | 360/114 |
| 3,491,351 | 1/1970 | Smaller et al. ..................... | 360/114 |
| 3,775,570 | 11/1973 | Lewicki et al. ..................... | 360/114 |

Primary Examiner—Robert S. Tupper
Attorney, Agent, or Firm—G. E. Grosser

[57] ABSTRACT

A method and apparatus are disclosed for retrieving magnetically recorded information by optical means. The magnetic recording is irradiated by a beam of coherent light whose plane of polarization is periodically varied. The light which is transmitted or reflected from the recording medium is analyzed in order to retrieve the magnetically recorded information.

6 Claims, 2 Drawing Figures

MAGNETO-OPTICAL READOUT APPARATUS

BACKGROUND OF THE INVENTION

1. Field of the Invention

This invention relates to retrieval of magnetically recorded information by optical means using the property of a magnetic field to rotate the plane of polarization of a beam of coherent light. This property is commonly known as the Faraday Effect where the light is transmitted through the recording medium and the Kerr Effect where the light is reflected therefrom.

2. Description of the Prior Art

A technique for retrieving magnetically recorded information by use of the Kerr or Faraday Effects is disclosed in U.S. Pat. No. 3,284,785, issued to Kornei. In the apparatus described by Kornei, a "rotator" (driven by a fixed frequency signal) periodically oscillates the direction of polarization of a beam of coherent polarized light which has been reflected from a magnetic recording medium. A phase detector measures the difference between the phase of the signal driving the rotator and the phase of the oscillated light beam.

One problem with this approach is that optical non-homogeneities which are present in the recording medium also influence the phase difference which is measured. Such influence is particularly troublesome because the shifts in the direction of the polarized beam which result from the magnetic recording (Kerr or Faraday Effect shifting) are quite small. In fact, if severe optical non-homogeneities are present in the recording medium, relative phase changes in the reflected light beam caused by the magnetic recording may be masked entirely by noise resulting from optical modulation of the beam.

SUMMARY OF THE INVENTION

Apparatus according to the invention utilizes the Kerr or Faraday Effects in producing a periodic signal having an asymmetry characteristic representative of the magnetic recording on a record medium. By electronically analyzing the asymmetry of the periodic signal, the information of the magnetic recording is extracted and produced in a signal form suitable for a utilization device such as a loudspeaker or computing apparatus.

With the use of waveform asymmetry to represent recorded information, phase comparisons between a modulated and a fixed frequency signal are not required. The magnetic record is represented by the asymmetric signal alone. No comparison to a signal which has not been influenced by the record medium occurs, and the problems of phase shifts resulting from optical non-homogeneities in the recording medium are to a large measure avoided.

In accordance with a preferred implementation of the invention, a polarized beam is periodically oscillated and then subjected to Faraday Effect rotation by a magnetic recording. The range of the oscillation is preferably chosen to be greater than the expected range of the magnetic rotation. A photodetector in combination with a polarizer then produces a signal according to the component of the light beam perpendicular to the original polarization of the beam. This signal is periodic and exhibits an asymmetry characteristic representative of rotations caused by the magnetic recording.

According to a significant aspect of this implementation of the invention, the periodic signal is selectively filtered to pass the frequency at which the beam is oscillated (say N) and the first even harmonic of that frequency (2N). A new signal is then produced by summing the filtered signals, which new signal exhibits less noise than the original waveform yet includes essential asymmetry information. (This filtering of the periodic signal takes recognition of the significance of the fundamental and first even harmonic components in Fourier analysis of an asymmetric periodic signal.)

Finally, a signal output is produced based on a comparison of zero crossover intervals for the waveform of the new signal.

In accordance with the foregoing, it is a purpose of the invention to provide an optical "reader" for a magnetic recording which is relatively insensitive to noise in the form of phase delays resulting from optical non-homogeneities in the record medium.

Moreover, it is a purpose of the invention to provide such a reader where the magnetically recorded information is extracted and reproduced in the form of a periodic signal wherein asymmetry of the signal waveform is representative of that information.

It is a further purpose of the invention to provide such a reader wherein selected dominant frequency components of the asymmetrical periodic signal are utilized in analyzing that signal for the information content thereof.

DESCRIPTION OF THE ILLUSTRATIVE EMBODIMENT

Figure 1:
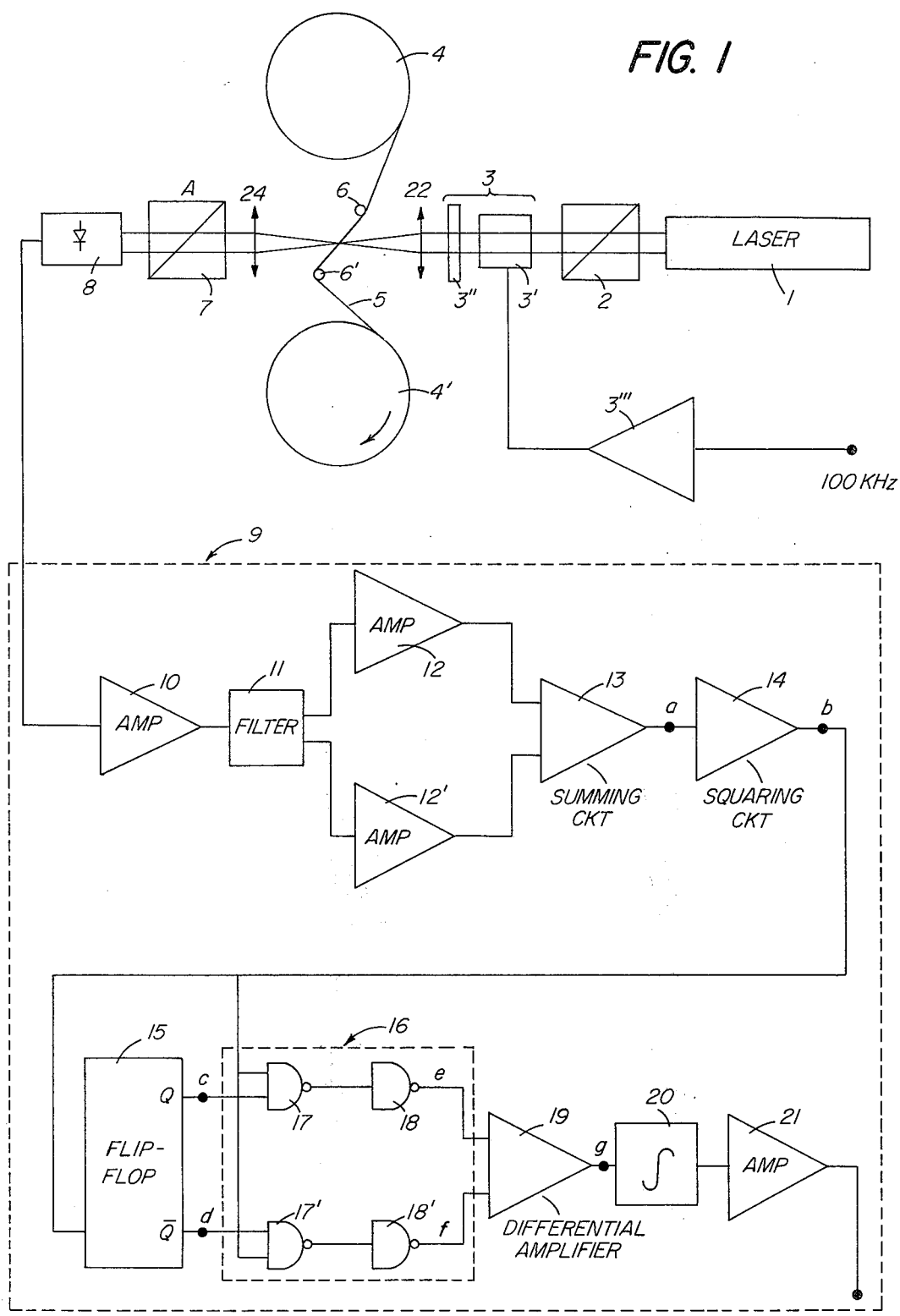
FIG. 1 is a diagram, generally in block form, which illustrates the preferred apparatus according to the invention.

In FIG. 1, there is shown a device according to the invention, adapted for reading magnetically recorded data carried by a sample of magnetized material, which may be a magnetic tape. The device comprises a laser 1 which generates a luminous beam on whose axis are placed, in order, a polarizer 2, an electro-optic modulator 3, a lens 22, a sample of a magnetized material 5, which is, in the present case, a magnetic tape transparent to luminous radiation that crosses it, a lens 24, an analyzer 7 in a crossed position with respect to the polarizer 2, a photosensitive receiver 8, and an electronic circuit 9. The sample is situated in such a manner that its magnetization vector displays a component on the axis of the laser beam.

The laser 1, the polarizer 2, and the modulator 3 constitute a source of a linearly polarized luminous beam in which modulator 3 causes the direction of the polarization plane to oscillate according to the formula:

$$\alpha = \alpha_o \sin \omega t$$

$\alpha_o$ being the amplitude of the oscillation $$\omega = 2\pi N$$

$N$ being the frequency of oscillation.

If the sample 5 is not magnetized, it does not rotate the polarization plane of the beam that crosses it, and the intensity I of the radiation that reaches receiver 8 is then, according to the law of Malus, $$I = K \sin^2 (\alpha_o \sin \omega t)$$

$K$ being a constant

If the sample is magnetized, it produces a $\beta$ rotation of the polarization plane, proportionate to its magnetization; the intensity of the radiation that reaches the receiver 8 is:

$$I = K \sin^2 (\beta + \alpha_o \sin \omega t)$$

The photosensitive receiver 8 then provides at its output a current $i$ of formula:

$$i = K' \sin^2 (\beta + \alpha_o \sin \omega t)$$

$K'$ being a constant proportional to $K$

A mathematical processing of the latter formula shows that current $i$ has a continuous component and an alternating component. The wave shape of the alternating component is represented by waveform $a$ in FIG. 2. When the sample under consideration is a magnetic tape, the $\beta$ rotation is small, often much less than a degree. Then, if the modulation $\alpha = \alpha_o \sin \omega t$, applied to the position of the polarization plane of the beam by modulator 3, is selected in such a manner than $\alpha_o$ is also small (on the order of a degree), it can be shown using trigonometric identities that the successive positive halfwaves of the alternating component of $i$ have respectively as durations (see FIG. 2, $a$):

$$\Delta t_1 \cong \frac{1}{\omega}\left(\frac{\pi}{2} + 2\sqrt{2}\frac{B}{\alpha_o}\right) = k + K'\beta$$
(Equation 1)

$$\Delta t_2 \cong \frac{1}{\omega}\left(\frac{\pi}{2} - 2\sqrt{2}\frac{B}{\alpha_o}\right) = K - K'\beta$$
(Equation 2)

where $$k = \frac{\pi}{2\omega}$$

$$K' = \frac{2\sqrt{2}}{w \alpha_o}$$

Consequently, in the case whtn $\beta$ and $\alpha_o$ are small, it is easy to extract $\beta$ from the above formulas (I), knowing $\Delta t_1$ and $\Delta t_2$.

Since the measurement of which is taken only at the moments when the alternating component of $i$ passes through zero, is not affected by the "noise" due to the variations of the amplitude of this component, since this amplitude is not present in Equations 1 and 2.

Laser 1 may be a helium-neon laser. Its luminous beam is polarized rectilinearly by a polarizer 2 which may be a Glazebrook prism. Modulator 3 comprises a crystal 3' of KD*P (deuterated monopotassium phosphate), the axes of which are oriented by 45° with respect to the path of the light beam from the polarizer 2, to a quarter-wave plate 3'', one of the neutral axes of which is parallel to the direction of the polarizer prism. Crystal 3' is energized by an oscillator 3''' at a frequency N which, for the preferred implementation, is 100 KHz.

Thus, at the output of the modulator, the luminous beam has a constant amplitude and the direction of its polarization plane oscillates at the frequency N around the direction of polarizer 2, at an angle $\alpha_o$ which is adjusted to a value on the order of a degree.

The beam exiting from the quarter-wave plane 3'' is passed through lens 22 which focuses it on the sample 5. A driving mechanism (not shown) advances the sample through the beam. The sample unwinds from a spool 4, and is taken up onto another spool 4' after having passed around two guides 6, 6', which arrange that portion of the sample which intersects the beam at an angle to the beam axis. Thus, the magnetizing vector of the sample (assumed to be recorded longitudinally) has a component along the axis of the beam, this component causing the position of the polarization plane of the beam to rotate by an amount $\beta$, by means of the Faraday Effect.

The beam that emerges from the sample is passed through lens 24 and analyzer 7 (which may be another Glazebrook prism) to be finally received by the photosensitive receiver 8, which may be a silicon photodiode.

Photosensitive receiver 8 delivers a first signal which feeds electronic circuit 9, which in turn processes the signal so as to form a second signal proportionate to $\beta$, the rotation of the plane of polarization due to the magnetization of the sample.

Circuit 9 comprises, in series, an amplifier 10, a selective filter 11, a pair of amplifiers 12, 12' in parallel, an adder 13, a comparator 14, a flip-flop 15, a logic unit 16, a wide band differential amplifier 19, an integrator 20, and a low-frequency amplifier 21. Elements 10, 11, 12, 12', and 13 constitute an input sub-circuit, whereas elements 15, 16, and 19 constitute a processing arrangement. The logic unit 16 comprises two electronic gates 17, 17' with logical function NAND, and two electronic gates 18, 18' of logical function NOT. Gates 17 and 18 are connected, in series, between an output $\overline{Q}$ of flip-flop 15, and an input of differential amplifier 19. Gates 17' and 18' are connected, in series, between the other output Q of flip-flop 15 and the other input of differential amplifier 19. Gates 17 and 17' each have their other input fed by the output of comparator 14.

Electronic circuit 9 functions as follows: The first signal formed by the receiver 8 is supplied to amplifier 10. The signal formed by the amplifier 10 feeds the selective filter 11 which separates the components at the frequency N and at the frequency 2N so as to direct them toward the amplifiers 12 and 12', respectively. Such separation of frequencies may also be achieved by using amplifiers with selective bandpass characteristics. The signal under study is then recomposed by adder 13. At the output terminal $a$, a signal appears which, when a $\beta$ rotation of the polarization plane of the luminous beam is induced by the sample 5, displays the wave shape represented in $a$ of FIG. 2.

Comparator 14 delivers, at the input of the flip-flop 15, a rectangular pulse for each positive half-wave of the output signal of the adder 13. Thus, at the input of the flip-flop 15 there is a signal represented by $b$ in FIG. 2, which takes the shape of a train of rectangular pulses. Signals $c$ and $d$ (FIG. 2) appear at the outputs Q and $\overline{Q}$ of flip-flop 15.

Figure 2:
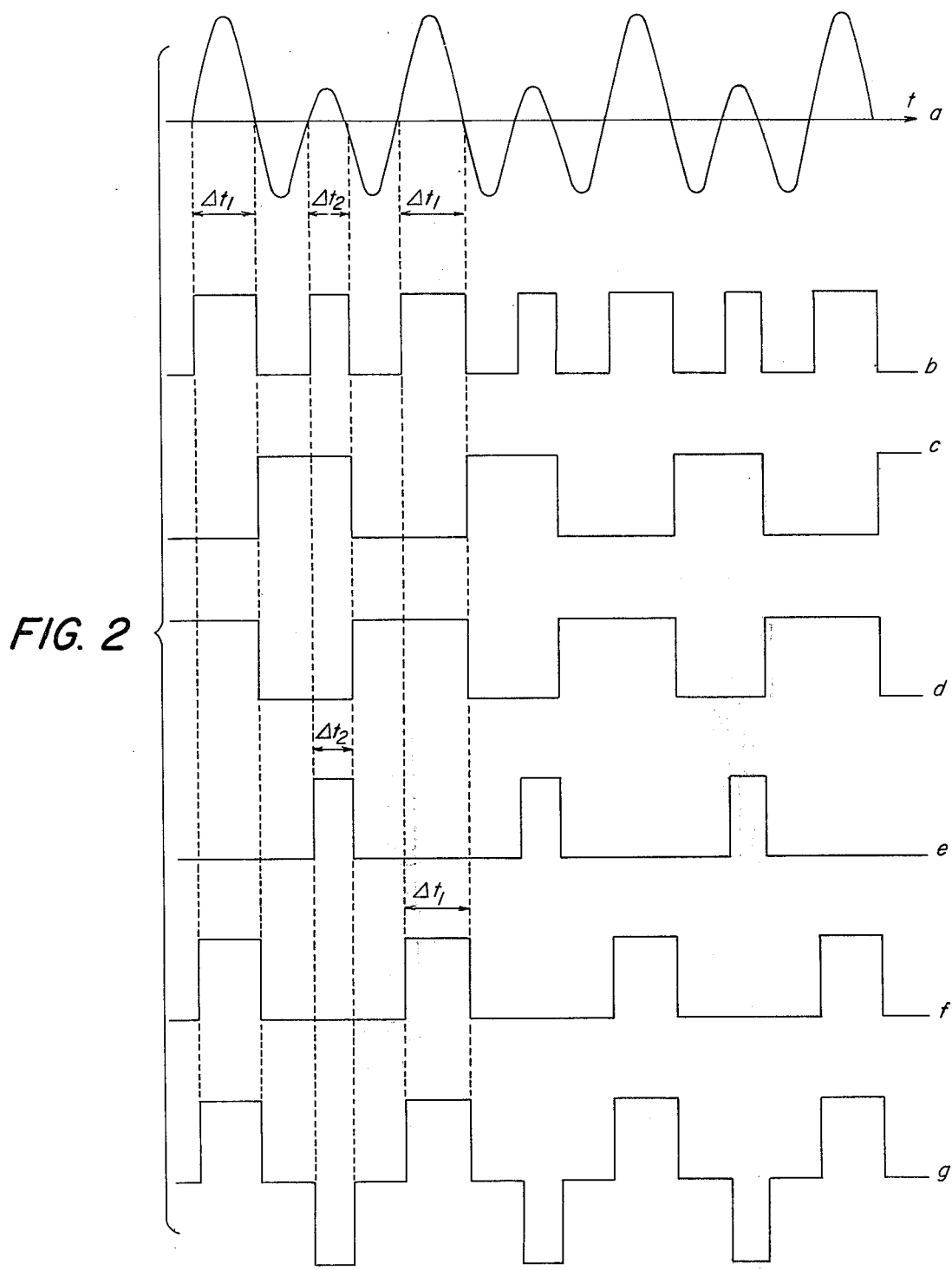
FIG. 2 is a set of waveforms representative of typical signals appearing at different points in the apparatus of FIG. 1.

Logic unit 16 is thus fed by the signals represented by $b$, $c$, and $d$ in FIG. 2. The NAND gate 17 combines signals $b$ and $c$ so that at the output of NOT gate 18 a signal appears represented by $e$ formed from alternate pulses of signal *b* and having a pulse width $\Delta t_2$. Likewise, NAND gate 17' combines signals *b* and *d* so that at the output of NOT gate 18', signal *f* of FIG. 2 appears, formed of the other pulses of signal *b* and having a pulse width $\Delta t_1$.

Signals *e* and *f* feed the differential amplifier 19, the output of which provides the auxiliary signal *g* which assumes the shape of a second train of retangular pulses of the same amplitude, alternately positive and negative, and of $\Delta t_1$ and $\Delta t_2$ width, respectively. Integrator 20 is fed by signal *g* and produces a signal directly proportionate to $(t_1 - t_2)$. Which quantity is found by differencing Equations 1 and 2 to be:

$$t_1 - t_2 = 2 k' \beta$$

(Equation 3 )

Therefore, a signal proportionate to $\beta$ is obtained. Since $\beta$ in turn is proportionate to the magnetization of the sample passing through the luminous beam of the device, the obtained signal makes it possible to "read" the magnetically recorded data on the sample. Amplifier 21, fed by the output of the integrator, may then be used to feed a transducer (not shown), such as a loudspeaker.

As seen above, the preferred embodiment of the invention comprises a modulator 3 consisting of a deuterated KDP crystal, energized by an electrical oscillator, and of a quarter-wave plate. This crystal may be replaced by an electrically birefringent material or with a piezoelectric material energized by an acoustical wave. Furthermore, a modulator usuable in the device according to the invention may be formed from a material displaying the Faraday Effect when it is placed in an alternating magnetic field, or with a polarizer oscillated mechanically.

Although the preferred embodiment of the invention involves the Faraday Effect, it is obvious that the Kerr Effect could also be used, particularly for retrieving information from a sufficiently reflecting magnetic recording medium.

The invention has been described in detail with particular reference to a preferred embodiment thereof, but it will be understood that variations and modifications can be effected within the spirit and scope of the invention.

What is claimed is:

1. An optical apparatus for reading magnetic records on a recording medium, comprising:
   a. means for beaming light, which is polarized in a first direction, onto such a recording medium whereby there is caused a rotation of the direction of polarization of said beam in accordance with the magnetic characteristics of the magnetic records thereon;
   b. oscillator means for causing a periodic oscillation in the direction of beam polarization at a preselected oscillator frequency;
   c. detector means, located in the path of said light beam after said recording medium and said oscillator means, for receiving said beam and for producing a first substantially periodic signal having alternating components in accordance with the angle of the instantaneous polarization direction of said beam in relationship to said first direction; and
   d. circuit means for receiving said first signal and for producing a second signal based thereon which is representative of the characteristics of the magnetic record, said circuit means being responsive to the relative duration intervals for adjacent similar-polarity segments of the alternating component of said first signal.

2. An apparatus according to claim 1 wherein said circuit means includes: (1) means for selectively filtering said first signal, which filtering means preferentially passes signal components in frequency bands around the oscillator frequency and the first even harmonic of the oscillator frequency; (2) means for combining the signal portions passing through said filtering means to produce a composite signal; and (3) means responsive to the polarity of said composite signal for producing said second signal in accordance with the relative time intervals for adjacent positive-going sections of the composite signal waveform.

3. An apparatus according to claim 1 wherein said detector means includes (1) polarizing means, located on the path of said light beam after said oscillating means and said record medium, for intercepting said polarized beam and for preferentially passing that component thereof having a direction substantially perpendicular to said first direction; and (2) photosensitive means, located on the path of said light beam after said polarizing means, for producing a signal output in accordance with the intensity of the light beam component passing through said polarizing means.

4. For use in reading a magnetic record on a recording medium, a magneto-optical apparatus comprising:
   a. means for beaming light, which is polarized in a first direction, onto such a recording medium, whereby there is caused a rotation of the direction of polarization of said beam which is representative of the magnetic characteristics of the record stored thereon;
   b. oscillator means for causing a periodic oscillation in the direction of polarization of said beam at a preselected oscillator frequency;
   c. detector means, located on the path of said polarized beam beyond said oscillator means and beyond the recording medium for receiving said beam, said detector means including (1) analyzer means for attenuating the polarized beam in accordance with the instantaneous angle of polarization of said beam, and (2) photosensitive means for receiving the output beam of said analyzer means and for producing a first signal in accordance with the intensity thereof, which first signal by virtue of the magnetic rotation and the oscillation of said beam is characterized by an asymmetric periodic waveform; and
   d. circuit means, responsive to the relative durations of adjacent positive polarity segments of the alternating component of said first signal, for producing a second signal which is representative of the magnetic characteristics of the record.

5. A magneto-optical apparatus according to claim 4 wherein said analyzer means is a polarizer which is arranged with a polarization direction which is at right angles to said first direction.

6. For use in a magneto-optic readout apparatus of the type having means for directing a beam polarized in a first plane onto a sample bearing a magnetic record to thereby cause rotation of the plane of polarization of such beam in accordance with such magnetic record, and means for oscillating the angle of the plane of beam polarization at a preselected oscillator frequency, an apparatus comprising:
- a polarizer arranged in the beam path with a polarization plane at substantially right angles to said first beam polarization plane;
- photosensitive means for receiving the output beam of said polarizer and for producing a first signal in accordance with the intensity thereof;
- means for filtering said first signal to preferentially retain components in frequency bands around the oscillator frequency and the second harmonic of the oscillator frequency, the resulting filtered first signal being characterized by changes of polarity which occur in accordance with the relative contributions of the retained frequency components; and
- circuit means for receiving the filtered first signal and for producing based thereon a second signal which is representative of the magnetic record, which means includes first means for producing pulses in response to one polarity of the filtered first signal, second means for alternating the polarity of such pulses, and means for integrating the output pulses of said second means to produce said second signal.

* * * * *

UNITED STATES PATENT OFFICE
CERTIFICATE OF CORRECTION

PATENT NO. : 3,947,890
DATED : March 30, 1976
INVENTOR(S) : Guy Claude Daniel Travot and Gerard Rene Sirand-Rey It is certified that error appears in the above-identified patent and that said Letters Patent are hereby corrected as shown below:

Column 3, line 50: Delete "whtn" and insert --when--.

Column 4, line 39: Delete "$\overline{Q}$" and insert --Q--.

Column 4, line 41: Delete "Q" and insert --$\overline{Q}$--.

Column 6, line 22: Insert the word "light" before the word "beam".

Signed and Sealed this

Seventeenth Day of July 1979

[SEAL]

Attest:

LUTRELLE F. PARKER

*Attesting Officer*    *Acting Commissioner of Patents and Trademarks*